United States Patent
Moden

(10) Patent No.: US 7,381,591 B2
(45) Date of Patent: *Jun. 3, 2008

(54) FLIP-CHIP ADAPTOR PACKAGE FOR BARE DIE

(75) Inventor: Walter L. Moden, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/437,550

(22) Filed: May 19, 2006

(65) Prior Publication Data

US 2006/0211174 A1 Sep. 21, 2006

Related U.S. Application Data

(60) Continuation of application No. 11/070,364, filed on Mar. 1, 2005, which is a continuation of application No. 09/699,537, filed on Oct. 30, 2000, now Pat. No. 6,861,290, which is a division of application No. 09/483,483, filed on Jan. 14, 2000, now Pat. No. 6,265,766, which is a continuation of application No. 08/948,936, filed on Oct. 10, 1997, now Pat. No. 6,201,304, which is a continuation of application No. 08/574,662, filed on Dec. 19, 1995, now Pat. No. 5,719,440.

(51) Int. Cl.
*H01L 21/00* (2006.01)

(52) U.S. Cl. .................. 438/118; 438/127; 257/698; 257/E23.011

(58) Field of Classification Search ............... 438/109, 438/112, 118, 127, FOR. 367, FOR. 384; 257/686, 687, 693, 698, 730, 774, E33.056, 257/E23.001, E23.011, E21.499, 672
See application file for complete search history.

(56) References Cited

U.S. PATENT DOCUMENTS 3,648,131 A     3/1972    Stuby
(Continued)

FOREIGN PATENT DOCUMENTS

JP          60-194548        10/1985
(Continued)

OTHER PUBLICATIONS

Anthony, T.R., "Forming electrical interconnections through semiconductor wafers," J. Appl. Phys., vol. 52, No. 8, Aug. 1981, pp. 5340-5349.

(Continued)

*Primary Examiner*—Brook Kebede
*Assistant Examiner*—Khiem D Nguyen
(74) *Attorney, Agent, or Firm*—TraskBritt

(57) ABSTRACT

A board for connecting a bare semiconductor die with a bond pad arrangement which does not conform to a master printed circuit board with a specific or standardized pin out, connector pad, or lead placement arrangement. The board comprises a printed circuit board including first elements, such as minute solder balls, pins, or bond wires, for making electrical contact between the board and the master board, and second elements, such as minute solder balls, pins, or bond wires, for making electrical contact between the semiconductor die and the board. The board has circuit traces for electrical communication between the board/master board electrical contact elements, and the semiconductor die board electrical contact elements.

11 Claims, 4 Drawing Sheets

U.S. PATENT DOCUMENTS

| | | |
|---|---|---|
| 4,199,777 A | 4/1980 | Maruyama et al. |
| 4,371,912 A | 2/1983 | Guzik |
| 4,446,477 A | 5/1984 | Currie et al. |
| 4,483,067 A | 11/1984 | Parmentier |
| 4,505,799 A | 3/1985 | Baxter |
| 4,638,348 A | 1/1987 | Brown et al. |
| 4,649,418 A | 3/1987 | Uden |
| 4,725,924 A | 2/1988 | Juan |
| 4,731,645 A | 3/1988 | Parmentier et al. |
| 4,761,681 A | 8/1988 | Reid |
| 4,829,666 A | 5/1989 | Haghiri-Tehrani |
| 4,841,355 A | 6/1989 | Parks |
| 4,868,712 A | 9/1989 | Woodman |
| 4,899,107 A | 2/1990 | Corbett et al. |
| 4,931,853 A | 6/1990 | Ohuchi et al. |
| 4,954,458 A | 9/1990 | Reid |
| 4,956,694 A | 9/1990 | Eide |
| 4,975,765 A | 12/1990 | Ackermann et al. |
| 4,992,849 A | 2/1991 | Corbett et al. |
| 4,992,850 A | 2/1991 | Corbett et al. |
| 4,996,587 A | 2/1991 | Hinrichsmeyer et al. |
| 5,012,323 A | 4/1991 | Farnworth |
| 5,022,580 A | 6/1991 | Pedder |
| 5,041,396 A | 8/1991 | Valero |
| 5,043,794 A | 8/1991 | Tai et al. |
| 5,048,179 A | 9/1991 | Shindo et al. |
| 5,063,177 A | 11/1991 | Geller et al. |
| 5,068,205 A | 11/1991 | Baxter et al. |
| 5,075,253 A | 12/1991 | Sliwa et al. |
| 5,086,018 A | 2/1992 | Conru et al. |
| 5,099,309 A | 3/1992 | Kryzaniwsky |
| 5,107,328 A | 4/1992 | Kinsman et al. |
| 5,107,329 A | 4/1992 | Okinaga et al. |
| 5,128,831 A | 7/1992 | Fox, III et al. |
| 5,138,434 A | 8/1992 | Wood et al. |
| 5,155,067 A | 10/1992 | Wood et al. |
| 5,188,984 A | 2/1993 | Nishiguchi |
| 5,191,511 A | 3/1993 | Sawaya |
| 5,200,363 A | 4/1993 | Schmidt |
| 5,216,278 A | 6/1993 | Lin et al. |
| 5,218,234 A | 6/1993 | Thompson et al. |
| 5,222,014 A | 6/1993 | Lin |
| 5,231,304 A | 7/1993 | Solomon |
| 5,239,198 A | 8/1993 | Lin et al. |
| 5,239,447 A | 8/1993 | Cotues et al. |
| 5,258,330 A | 11/1993 | Khandros et al. |
| 5,266,912 A | 11/1993 | Kledzik |
| 5,286,679 A | 2/1994 | Farnworth et al. |
| 5,291,062 A | 3/1994 | Higgins, III |
| 5,293,068 A | 3/1994 | Kohno et al. |
| 5,294,750 A | 3/1994 | Sakai et al. |
| 5,299,092 A | 3/1994 | Yaguchi et al. |
| 5,311,401 A | 5/1994 | Gates, Jr. et al. |
| 5,313,096 A | 5/1994 | Eide |
| 5,326,428 A | 7/1994 | Farnworth et al. |
| 5,346,859 A | 9/1994 | Niwayama |
| 5,346,861 A | 9/1994 | Khandros et al. |
| 5,360,942 A | 11/1994 | Hoffman et al. |
| 5,373,189 A | 12/1994 | Massit et al. |
| 5,384,689 A | 1/1995 | Shen |
| 5,397,917 A | 3/1995 | Ommen et al. |
| 5,397,921 A | 3/1995 | Karnezos |
| 5,400,003 A | 3/1995 | Kledzik |
| 5,409,865 A | 4/1995 | Karnezos |
| 5,419,807 A | 5/1995 | Akram et al. |
| 5,420,460 A | 5/1995 | Massingill |
| 5,422,514 A | 6/1995 | Griswold et al. |
| 5,426,072 A | 6/1995 | Finnila |
| 5,434,106 A | 7/1995 | Lim et al. |
| 5,434,452 A | 7/1995 | Higgins |
| 5,454,161 A | 10/1995 | Beilin et al. |
| 5,468,999 A | 11/1995 | Lin |
| 5,473,512 A | 12/1995 | Degani et al. |
| 5,474,957 A | 12/1995 | Urushima |
| 5,486,723 A | 1/1996 | Ma et al. |
| 5,489,804 A | 2/1996 | Pasch |
| 5,508,556 A | 4/1996 | Lin |
| 5,528,080 A | 6/1996 | Goldstein |
| 5,536,685 A | 7/1996 | Burward-Hoy |
| 5,541,450 A | 7/1996 | Jones et al. |
| 5,545,291 A | 8/1996 | Smith et al. |
| 5,578,869 A | 11/1996 | Hoffman et al. |
| 5,608,265 A | 3/1997 | Kitano et al. |
| 5,615,089 A | 3/1997 | Yoneda et al. |
| 5,616,958 A | 4/1997 | Laine et al. |
| 5,625,221 A | 4/1997 | Kim et al. |
| 5,636,104 A | 6/1997 | Oh |
| 5,637,536 A | 6/1997 | Val |
| 5,637,915 A | 6/1997 | Sato et al. |
| 5,639,695 A | 6/1997 | Jones et al. |
| 5,639,696 A | 6/1997 | Liang et al. |
| 5,642,261 A | 6/1997 | Bond et al. |
| 5,648,679 A | 7/1997 | Chillara et al. |
| 5,663,593 A | 9/1997 | Mostafazadeh et al. |
| 5,668,405 A | 9/1997 | Yamashita |
| 5,674,785 A * | 10/1997 | Akram et al. ............... 438/15 |
| 5,675,180 A | 10/1997 | Pedersen et al. |
| 5,677,566 A | 10/1997 | King et al. |
| 5,682,061 A | 10/1997 | Khandros et al. |
| 5,689,091 A | 11/1997 | Hamzehdoost et al. |
| 5,696,033 A | 12/1997 | Kinsman |
| 5,714,405 A | 2/1998 | Tsubosaki et al. |
| 5,723,907 A | 3/1998 | Akram |
| 5,729,432 A | 3/1998 | Shim et al. |
| 5,734,198 A | 3/1998 | Stave |
| 5,739,585 A | 4/1998 | Akram et al. |
| 5,739,588 A | 4/1998 | Ishida et al. |
| 5,741,622 A | 4/1998 | Arima |
| 5,744,862 A | 4/1998 | Ishii |
| 5,767,575 A | 6/1998 | Lan et al. |
| 5,770,347 A | 6/1998 | Saitoh et al. |
| 5,780,923 A | 7/1998 | Courtenay |
| 5,783,866 A | 7/1998 | Lee et al. |
| 5,783,870 A | 7/1998 | Mostafazadeh et al. |
| 5,789,803 A | 8/1998 | Kinsman |
| 5,796,586 A | 8/1998 | Lee et al. |
| 5,804,874 A | 9/1998 | An et al. |
| 5,804,880 A | 9/1998 | Mathew |
| 5,811,879 A | 9/1998 | Akram |
| 5,814,883 A | 9/1998 | Sawai et al. |
| 5,815,372 A | 9/1998 | Gallas |
| 5,818,698 A | 10/1998 | Corisis |
| 5,834,945 A | 11/1998 | Akram et al. |
| 5,835,988 A | 11/1998 | Ishii |
| 5,844,315 A | 12/1998 | Melton et al. |
| 5,848,467 A | 12/1998 | Khandros et al. |
| 5,852,326 A | 12/1998 | Khandros et al. |
| 5,883,426 A | 3/1999 | Tokuno et al. |
| 5,893,726 A | 4/1999 | Farnworth et al. |
| 5,903,049 A | 5/1999 | Mori |
| 5,915,169 A | 6/1999 | Heo |
| 5,915,977 A | 6/1999 | Hembree et al. |
| 5,920,118 A | 7/1999 | Kong |
| 5,931,685 A | 8/1999 | Hembree et al. |
| 5,933,710 A | 8/1999 | Chia et al. |
| 5,950,304 A | 9/1999 | Khandros et al. |
| 5,952,611 A | 9/1999 | Eng et al. |
| 5,962,921 A | 10/1999 | Farnworth et al. |
| 5,963,430 A | 10/1999 | Londa |
| 5,994,166 A | 11/1999 | Akram et al. |
| 6,013,946 A | 1/2000 | Lee et al. |
| 6,013,948 A | 1/2000 | Akram et al. |
| 6,020,629 A | 2/2000 | Farnworth et al. |
| 6,028,365 A | 2/2000 | Akram et al. |

| | | |
|---|---|---|
| 6,046,072 A | 4/2000 | Matsuura et al. |
| 6,048,755 A | 4/2000 | Jiang et al. |
| 6,057,597 A | 5/2000 | Farnworth et al. |
| 6,072,233 A | 6/2000 | Corisis et al. |
| 6,091,140 A | 7/2000 | Toh et al. |
| 6,097,085 A | 8/2000 | Ikemizu et al. |
| 6,097,087 A | 8/2000 | Farnworth et al. |
| 6,107,109 A | 8/2000 | Akram et al. |
| 6,133,627 A | 10/2000 | Khandros et al. |
| 6,201,304 B1 | 3/2001 | Moden |
| 6,235,554 B1 | 5/2001 | Akram et al. |
| 6,262,477 B1 | 7/2001 | Mahulikar et al. |
| 6,265,766 B1 | 7/2001 | Moden |
| 6,268,649 B1 | 7/2001 | Corisis et al. |
| 6,331,939 B1 | 12/2001 | Corisis et al. |
| 6,372,527 B1 | 4/2002 | Khandros et al. |
| 6,392,306 B1 | 5/2002 | Khandros et al. |
| 6,433,419 B2 | 8/2002 | Khandros et al. |
| 6,455,928 B2 | 9/2002 | Corisis et al. |
| 6,465,893 B1 | 10/2002 | Khandros et al. |
| 6,825,569 B2 | 11/2004 | Jiang et al. |
| 6,861,290 B1 * | 3/2005 | Moden ........................ 438/118 |
| 2001/0030370 A1 | 10/2001 | Khandros et al. |
| 2002/0155728 A1 | 10/2002 | Khandros et al. |
| 2003/0168253 A1 | 9/2003 | Khandros et al. |
| 2005/0087855 A1 | 4/2005 | Khandros et al. |

FOREIGN PATENT DOCUMENTS

| | | |
|---|---|---|
| JP | 4-30544 | 2/1992 |
| JP | 4-107964 | 4/1992 |
| JP | 07-283274 | 10/1995 |

OTHER PUBLICATIONS

"Chip Scale Review," vol. 1, No. 1, May 1997.

Roget's II, The New Thesaurus, 3rd Edition, Houghton Mifflin Company, 1995, p. 213.

Random House Webster's College Dictionary, Random House, New York, 1997, p. 297.

* cited by examiner

FLIP-CHIP ADAPTOR PACKAGE FOR BARE DIE

CROSS-REFERENCE TO RELATED APPLICATIONS

This application is a continuation of application Ser. No. 11/070,364, filed Mar. 1, 2005, pending, which is a continuation of application Ser. No. 09/699,537, filed Oct. 30, 2000, now U.S. Pat. No. 6,861,290, issued Mar. 1, 2005, which is a divisional of application Ser. No. 09/483,483, filed Jan. 14, 2000, now U.S. Pat. No. 6,265,766, issued Jul. 24, 2001, which is a continuation of application Ser. No. 08/948,936, filed Oct. 10, 1997, now U.S. Pat. No. 6,201,304, issued Mar. 13, 2001, which is a continuation of application Ser. No. 08/574,662, filed Dec. 19, 1995, now U.S. Pat. No. 5,719,440, issued Feb. 17, 1998.

BACKGROUND OF THE INVENTION

1. Field of the Invention

The present invention relates to an apparatus for connecting a bare semiconductor die having a size and bond pad arrangement, either solder ball arrangement, or pin arrangement (hereinafter referred to generally as a "terminal arrangement"), which does not conform to a printed circuit board with a specific or standardized pin out, connector pad, or lead placement (hereinafter referred to generally as a "connection arrangement"). More particularly, the present invention relates to an intermediate conductor-carrying substrate (hereinafter referred to generally as an "adaptor board") for connecting a non-conforming bare die to another printed circuit board having a given connection arrangement (hereinafter referred to generally as a "master board").

2. State of the Art

Definitions: The following terms and acronyms will be used throughout the application and are defined as follows:

BGA—Ball Grid Array: An array of minute solder balls disposed on an attachment surface of a semiconductor die wherein the solder balls are refluxed for simultaneous attachment and electrical communication of the semiconductor die to a printed circuit board.

COB—Chip On Board: The techniques used to attach semiconductor dice to a printed circuit board, including flip-chip attachment, wire bonding, and tape automated bonding ("TAB").

Flip-Chip: A chip or die that has bumped terminations spaced around the active surface of the die and is intended for facedown mounting.

Flip-Chip Attachment: A method of attaching a semiconductor die to a substrate in which the die is flipped so that the connecting conductor pads on the face of the die are set on mirror-image pads on the substrate (i.e., printed circuit board) and bonded by refluxing the solder.

Glob Top: A glob of encapsulant material (usually epoxy or silicone or a combination thereof) surrounding a semiconductor die in the COB assembly process.

PGA—Pin Grid Array: An array of small pins extending substantially perpendicularly from the major plane of a semiconductor die, wherein the pins conform to a specific arrangement on a printed circuit board for attachment thereto.

SLICC—Slightly Larger than Integrated Circuit Carrier: An array of minute solder balls disposed on an attachment surface of a semiconductor die similar to a BGA, but having a smaller solder ball pitch and diameter than a BGA.

State-of-the-art COB technology generally consists of three semiconductor dies to printed circuit boards attachment techniques: flip-chip attachment, wire bonding, and TAB.

Flip-chip attachment consists of attaching a semiconductor die, generally having a BGA, a SLICC or a PGA, to a printed circuit board. With the BGA or SLICC, the solder ball arrangement on the semiconductor die must be a mirror-image of the connecting bond pads on the printed circuit board such that precise connection is made. The semiconductor die is bonded to the printed circuit board by refluxing the solder balls. With the PGA, the pin arrangement of the semiconductor die must be a mirror-image of the pin recesses on the printed circuit board. After insertion, the semiconductor die is generally bonded by soldering the pins into place. An under-fill encapsulant is generally disposed between the semiconductor die and the printed circuit board to prevent contamination. A variation of the pin-in-recess PGA is a J-lead PGA, wherein the loops of the Js are soldered to pads on the surface of the circuit board. Nonetheless, the lead and pad locations must coincide, as with the other referenced flip-chip techniques.

Wire bonding and TAB attachment generally begins with attaching a semiconductor die to the surface of a printed circuit board with an appropriate adhesive. In wire bonding, a plurality of bond wires are attached, one at a time, from each bond pad on the semiconductor die and to a corresponding lead on the printed circuit board. The bond wires are generally attached through one of three industry-standard wire bonding techniques: ultrasonic bonding, using a combination of pressure and ultrasonic vibration bursts to form a metallurgical cold weld; thermocompression bonding, using a combination of pressure and elevated temperature to form a weld; and thermosonic bonding, using a combination of pressure, elevated temperature, and ultrasonic vibration bursts. The die may be oriented either face up or face down (with its active surface and bond pads either up or down with respect to the circuit board) for wire bonding, although face up orientation is more common. With TAB, metal tape leads are attached between the bond pads on the semiconductor die and the leads on the printed circuit board. An encapsulant is generally used to cover the bond wires and metal tape leads to prevent contamination.

Although the foregoing methods are effective for bonding semiconductor dice to printed circuit boards, the terminal arrangements of the dice and the connection arrangements of the boards must be designed to accommodate one another. Thus, it may be impossible to electrically connect a particular semiconductor die to a printed circuit board for which the semiconductor die terminal arrangement was not designed to match the board's connection arrangement. With either wire bond or TAB attachment, the semiconductor die bond pad may not correspond to the lead ends on the circuit board, and thus attachment is either impossible or extremely difficult due to the need for overlong wires and the potential for inter-wire contact and shorting. With flip-chip attachment, if the printed circuit board connection arrangement is not a mirror-image of the solder ball or pin arrangement (terminal arrangement) on the semiconductor die, electrically connecting the flip-chip to the printed circuit board is impossible.

Therefore, it would be advantageous to develop an apparatus for connecting a semiconductor die having a size and bond pad arrangement, solder ball arrangement, or pin arrangement ("I/O pattern") which does not conform to a printed circuit board with a specific or standardized pin out, connection pad location, or lead placement ("I/O pattern").

SUMMARY OF THE INVENTION

The present invention relates to an intermediate printed circuit board or other conductor-carrying substrate that functions as an adaptor board for electrically connecting one or more bare semiconductor dice of a variety of sizes and bond pad locations, solder ball arrangement, or pin arrangement, to a master printed circuit board with a specific or standardized pin out, connector pad location, or lead placement.

An adaptor printed circuit board or substrate ("adaptor board") is sized and configured with an I/O pattern to accommodate its attachment to the master printed circuit board ("master board"). If the master board is configured to receive a specific pin out or specific connector pad locations, the adaptor board is configured on its master board attachment surface with pins or solder balls in mirror-image to the master board connection arrangement to make electrical contact with the specific pin out or connector pads on the printed circuit board. If the master board is configured to receive a bond wire, the adaptor board is configured and sized to provide wire bond pads on its upper surface closely adjacent the bond pads of the master board leads. The adaptor board can, of course, be configured to accommodate other attachment and electrical connection means known in the industry, as well as other components in addition to the semiconductor die or dice carried thereon.

On the semiconductor die side of the adaptor board, one or more semiconductor dice are attached. If a "flip-chip" die is attached to the adaptor board, the adaptor board will, of course, be configured with an I/O pattern to receive the flip-chip with a specific pin out or connector pad locations. The pin out or connector pads on the adaptor board are connected to circuit traces on or through the adaptor board. The circuit traces form the electrical communication path from the pin recesses or connector pads on the adaptor board to the connection points to the master board.

If a "leads over" die is used with the adaptor board, the bond pads on the die are wire bonded to the adaptor board. Preferably, the leads over die is attached to the adaptor board with the bond pads facing the adaptor board. The bond wires are attached to the leads over die bond pads and extend into a via or vias in the adaptor board. The bond wires are attached to an I/O pattern of adaptor board bond pads within the via from which circuit traces extend, or to leads on the master board side of the adaptor board.

It is, of course, understood that the leads over die can be attached to the adaptor board with the bond pads facing away from the adaptor board. Thus, the bond wires are simply attached to the bond pads on the leads over die and to a corresponding I/O pattern of adaptor board pad on the semiconductor die side of the adaptor board.

Preferably, the exposed circuitry of the die and the die-to-adaptor board interconnection is sealed from contamination by a glob top after wire bonding or an underflow compound in the case of a flip-chip attachment.

Furthermore, it is understood that with the use of wire bonds, the adaptor boards can be stacked on top of each other and connected to the adaptor board as by wire bonding.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
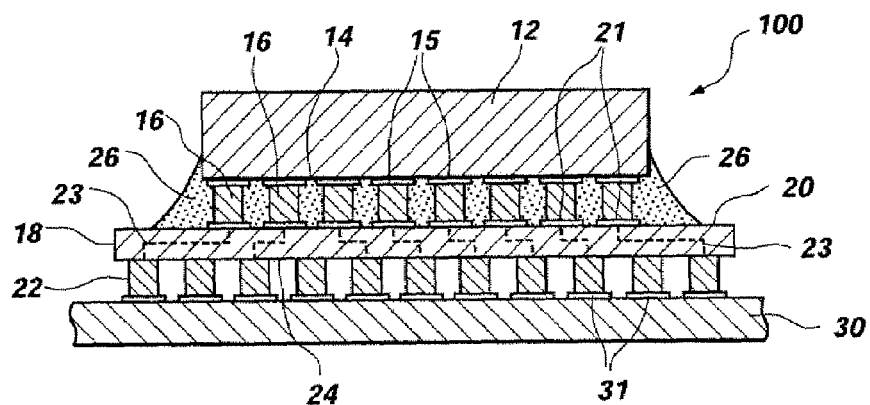
FIG. 1 is a side view of one embodiment of the present invention.

FIG. 1 illustrates a first embodiment of the present invention designated as a flip-chip style/flip-chip attachment assembly 100. Assembly 100 comprises a semiconductor die 12 having an inverted active surface 14 with at least one flip-chip electric connection 16 (such as a C4 solder bump connection, a pin connection, or a surface mount J-lead connection, by way of example) extending substantially perpendicularly from a bond pad 15 on the semiconductor die active surface 14. The flip-chip electric connections 16 are attached to an upper surface 20 of an adaptor board 18 in such a manner that the flip-chip electric connections 16 make electrical contact with electrical contact elements 21 in or on the surface of adaptor board 18. The electrical contact elements 21 make electrical communication between each flip-chip electric connection 16, through circuit traces 23 (exemplary traces shown in broken lines) in the adaptor board 18, to at least one master board connector 22 extending substantially perpendicularly from a lower surface 24 of the adaptor board 18 to connect adaptor board 18 to an aligned terminal 31 on master board 30. Preferably, a sealing compound 26 is disposed between the semiconductor die 12 and the adaptor board 18 to prevent contamination of the flip-chip electric connections 16 and to more firmly secure semiconductor die 12 to adaptor board 18.

In actual practice, there will be a plurality of terminals 31 arranged in a specific, perhaps industry-standard pattern, on master board 30, and master board connectors 22 will be arranged in a mirror-image pattern to terminals 31 for mating connection therewith. Master board connectors 22 and terminals 31 may comprise any electrical connection mechanism known in the art, in addition to those previously described herein.

Figure 2:
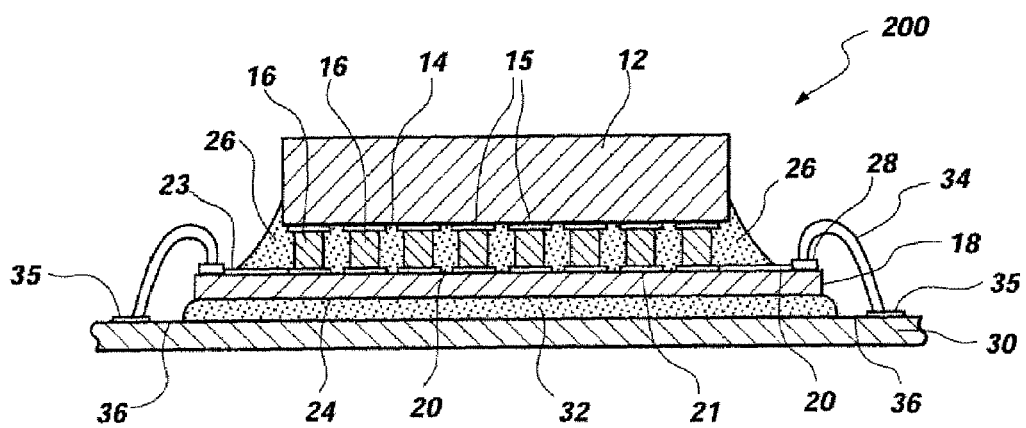
FIG. 2 is a side view of a second embodiment of the present invention.
Figure 2A:
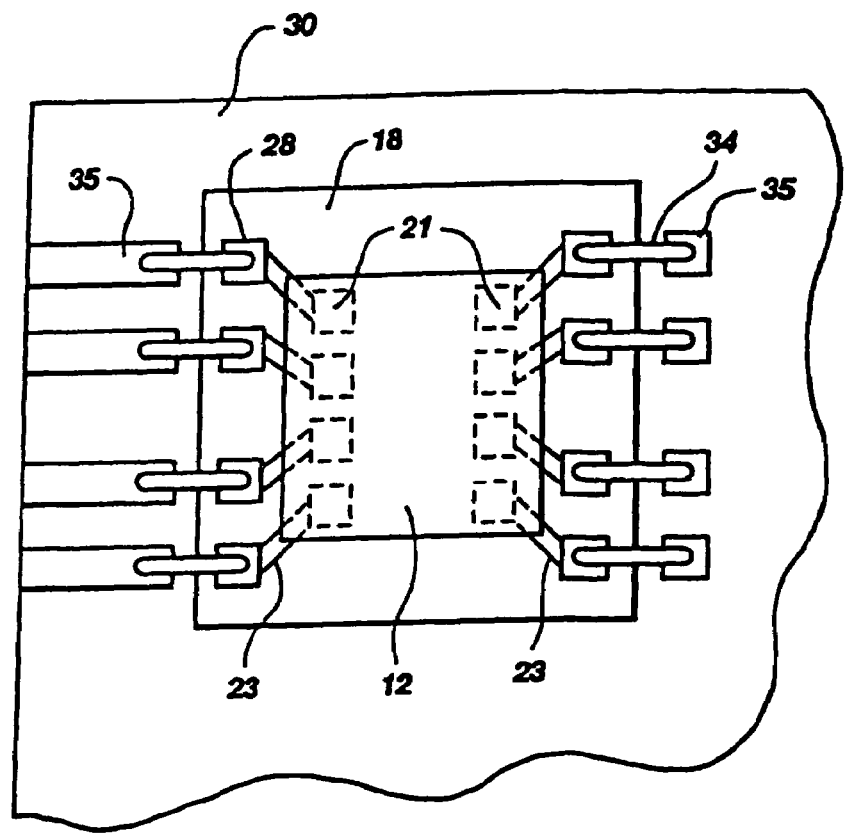
FIG. 2A is a top view of the second embodiment of the present invention shown in FIG. 2.

FIGS. 2 and 2A illustrate a second embodiment of the present invention designated as a flip-chip style/wire bond attachment assembly 200. Components common to both FIG. 1 and FIG. 2 retain the same numeric designation. The assembly 200 comprises the semiconductor die 12 having active surface 14 with at least one flip-chip electric connection 16, as known in the art, extending substantially perpendicularly from a bond pad 15 on the semiconductor die active surface 14. The flip-chip electric connections 16 are attached to the adaptor board upper surface 20 in such a manner that the flip-chip electric connections 16 make electrical contact with electrical contact elements 21 on the adaptor board 18. The electrical contact elements 21 communicate between each flip-chip electric connection 16 to bond pads 28 on the adaptor board upper surface 20 through circuit traces 23. The adaptor board lower surface 24 is bonded to an upper surface 36 of a master board 30 with an adhesive 32, which may comprise a liquid or gel adhesive, or an adhesive tape, all as known in the art. If desired, adhesive 32 may be a heat-conductive adhesive. A wire bond 34 extends from each adaptor board bond pad 28 to a corresponding bond pad or lead end 35 on the upper surface 36 of master board 30, bond pad or lead end 35 communicating with other components mounted to master board 30 or with other components on other boards or other assemblies through circuit traces or other conductors known in the art.

Figure 3:
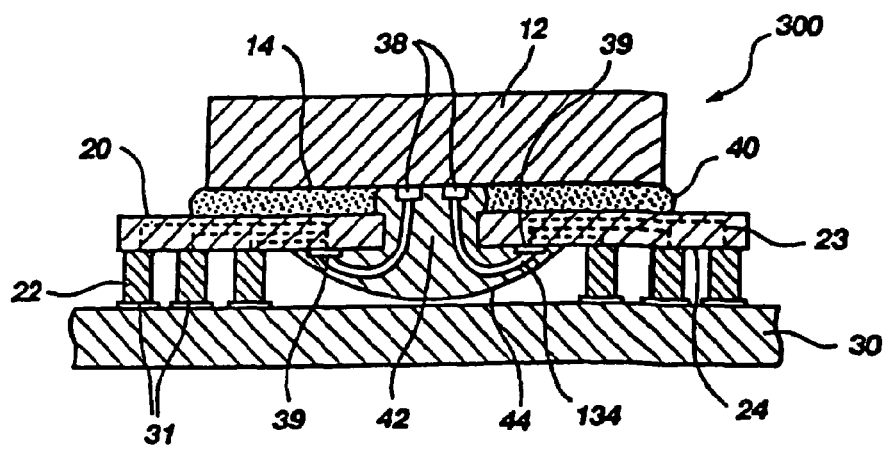
FIG. 3 is a side view of a third embodiment of the present invention.
Figure 3A:
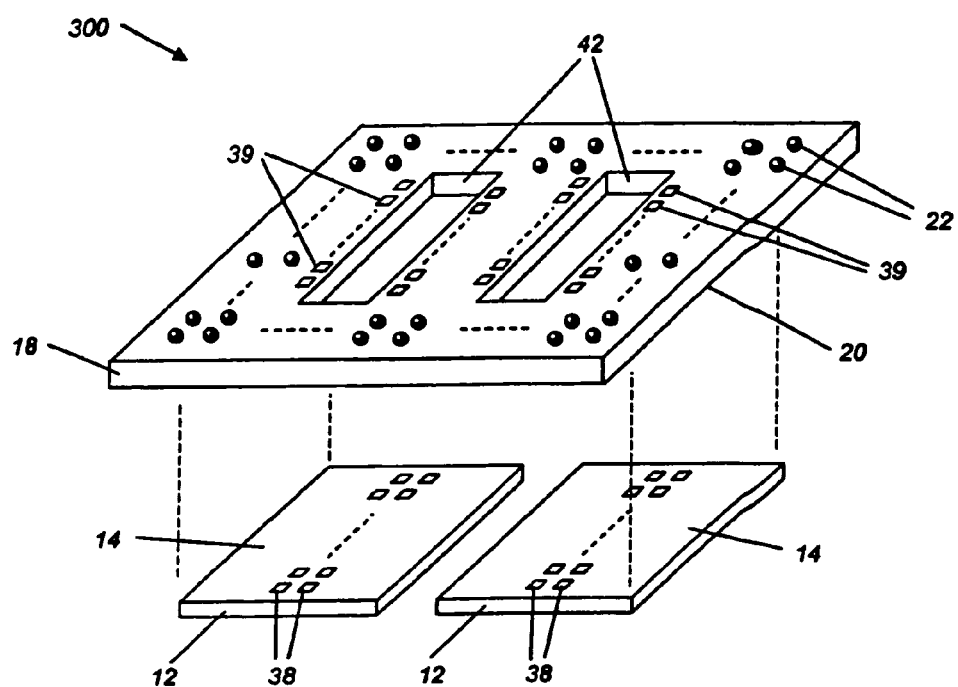
FIG. 3A is an upside-down exploded perspective view of selected portions of the third embodiment.

FIGS. 3 and 3A illustrate a third embodiment of the present invention designated as a wire bond style/flip-chip attachment assembly 300. Components which are common to the previous figures retain the same numeric designation. The assembly 300 comprises an inverted semiconductor die 12 having active surface 14 with at least one bond pad 38 on the semiconductor die active surface 14. As illustrated, the bond pads 38 are arranged in two rows extending down the longitudinal axis of semiconductor die 12 being located transverse to the plane of the page, such an arrangement commonly being used for a "leads over" connection to frame leads extending over the die in its normal, upright position. The semiconductor die active surface 14 is bonded to the adaptor board upper surface 20 with an insulating, sealing adhesive 40. The adaptor board 18 includes at least one or more wire bond vias 42 which is located in a position or positions aligned with the semiconductor die bond pads 38. Each individual wire bond 134 is connected to each corresponding individual semiconductor die bond pad 38. Each wire bond 134 extends from the semiconductor die bond pad 38 to a corresponding bond pad or lead 39 on the adaptor board lower surface 24, which communicates with master board connectors 22 through circuit traces 23. The master board terminals 31 are in electrical communication with at least one master board connector 22 extending substantially perpendicularly from the adaptor board lower surface 24. Preferably, a sealant 44 encases the bond wires 134 and seals the wire bond via 42 to prevent contamination and damage to the wire bonds.

Figure 4:
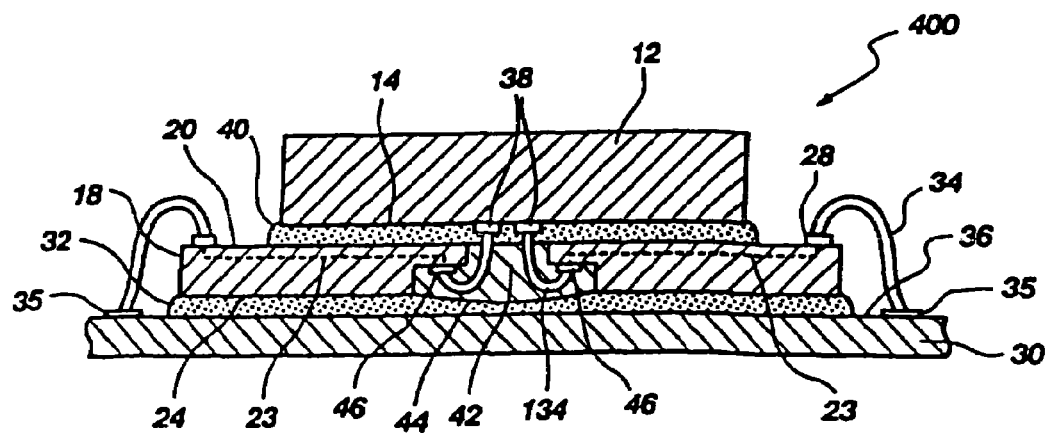
FIG. 4 is a side view of a fourth embodiment of the present invention.

FIG. 4 illustrates a fourth embodiment of the present invention designated as a wire bond style/wire bond attachment assembly 400. Components which are common to the previous figures retain the same numeric designation. The assembly 400 comprises the semiconductor die 12 having active surface 14 with at least one bond pad 38 on the semiconductor die active surface 14. As with the embodiment of FIG. 3, semiconductor die 12 in this instance employs bond pads 38 in a "leads over" configuration. The semiconductor die active surface 14 is bonded to the adaptor board upper surface 20 with an insulating, sealing adhesive 40. The adaptor board 18 includes at least one or more wire bond vias 42 which is located in a position or positions aligned with the semiconductor die bond pads 38. Each individual wire bond 134 is connected to each corresponding semiconductor die bond pad 38. Each wire bond 134 extends from the semiconductor die bond pad 38 to a corresponding bond pad 46 within the wire bond via 42. The via bond pads 46 are in electrical communication through circuit traces 23 with at least one corresponding adaptor board bond pad 28. The adaptor board lower surface 24 is bonded to the master board upper surface 36 with the adhesive 32. Wire bonds 34 extend from the adapter board upper surface 20 to a corresponding bond pad or lead end 35 on the master board upper surface 36. Preferably, the wire bond via sealant 44 encases the bond wires 134 and seals the wire bond via 42 to prevent contamination.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method for forming a stackable ball grid array package, comprising:
   using a substrate having a first surface for receiving a semiconductor die and having an opposing second surface and having an aperture;
   patterning conductors on the second surface to provide conductive paths between terminal pads located near the aperture and conductive element pads located near the periphery of the substrate;
   attaching an adhesively coated dielectric tape adjacent at least one side of the aperture of the substrate;
   mounting a semiconductor die on the first surface at least partially over the aperture, the die having one or more bond pads located over the aperture;
   connecting one or more bond pads of the semiconductor die to one of the terminal pads by a bond wire extending through the aperture;
   providing a material covering the bond wire and that portion of the semiconductor die overlying the aperture, the material having a first profile height with respect to the second surface; and
   forming one or more conductive elements disposed on the conductive element pads, the conductive elements having a second profile height with respect to the second surface that is greater than the first profile height.

2. The method of claim 1, wherein providing one or more conductive elements further comprises placing solder balls on the conductive element pads, and reflowing the solder balls to attach the solder balls to the conductive element pads.

3. The method of claim 1, wherein mounting a semiconductor die further comprises providing a die attach pad on the first surface of the substrate, the die attach pad being a dielectric material having an opening corresponding to the aperture in the substrate.

4. The method of claim 1, wherein providing a substrate further comprises providing isolated conductive element pads on the substrate for receiving additional conductive elements at locations isolated from the conductors on the substrate.

5. A method for forming a stackable bail grid array package, comprising:
   forming a substrate having a first surface for receiving a semiconductor die and having an opposing second surface and having an aperture;
   forming isolated conductive element pads on the substrate for receiving additional conductive elements at locations isolated from the conductors on the substrate;
   forming conductive vias between the first surface and the second surface of the substrate;
   patterning conductors on the second surface to provide conductive paths between terminal pads located near the aperture and the conductive element pads located near the periphery of the substrate;
   mounting a semiconductor die on the first surface at least partially over the aperture, the die having one or more bond pads located over the aperture;
   connecting one or more bond ads of the semiconductor die to one of the terminal pads by a bond wire extending through the aperture; and providing a material covering the bond wire and that portion of the semiconductor die overlying the aperture, the material having a first profile height with respect to the second surface;

forming one or more conductive elements disposed on the conductive element pads, the conductive elements having a second profile height with respect to the second surface that is greater than the first profile height.

6. The method of claim 5, wherein providing a substrate further comprises forming conductors on the first surface.

7. The method of claim 6, wherein providing a substrate further comprises forming conductive element pads on the first surface.

8. The method of claim 7, wherein providing a substrate further comprises providing conductive elements on the conductive element pads of the first surface.

9. A method for forming a stackable ball grid array package, comprising:

using a substrate having a first surface for receiving a semiconductor die and having an opposing second surface and having an aperture;

forming conductors on the first surface of the substrate;

forming conductive element ads on the first surface of the substrate;

forming conductive elements on the conductive element pads of the first surface of the substrate;

patterning conductors on the second surface to provide conductive paths between terminal pads located near the aperture and the conductive element pads located near the periphery of the substrate;

mounting a semiconductor die on the first surface at least partially over the aperture, the die having one or more bond pads located over the aperture;

connecting one or more bond pads of the semiconductor die to one of the terminal pads by a bond wire extending through the aperture;

providing a material covering the bond wire and that portion of the semiconductor die overlying the aperture, the material having a first profile height with respect to the second surface;

forming one or more conductive elements disposed on the conductive element pads, the conductive elements having a second profile height with respect to the second surface that is greater than the first profile height; and coupling at least one of the conductive elements on the first surface to a conductor on the first surface of the substrate.

10. A method for forming a stackable ball grid array package, comprising:

using a substrate having a first surface for receiving a semiconductor die and having an opposing second surface and having an aperture;

forming conductive vias between the first surface and the second surface of the substrate;

forming conductors on the first surface of the substrate;

forming conductive element pads on the first surface of the substrate;

forming conductive elements on the conductive element pads of the first surface of the substrate;

patterning conductors on the second surface to provide conductive paths between terminal pads located near the aperture and the conductive element pads located near the periphery of the substrate;

mounting a semiconductor die on the first surface at least partially over the aperture, the die having one or more bond pads located over the aperture;

connecting one or more bond pads of the semiconductor die to one of the terminal pads by a bond wire extending through the aperture;

forming a material covering the bond wire and that portion of the semiconductor die overlying the aperture, the material having a first profile height with respect to the second surface;

forming one or more conductive elements disposed on the conductive element pads, the conductive elements having a second profile height with respect to the second surface that is greater than the first profile height;

coupling at least one of the conductive elements on the first surface to a conductor on the first surface of the substrate: and coupling at least one conductive element on the first surface to a conductor on the first surface, to one of the conductive vias through the substrate, to a conductive trace on the second surface, and to a conductive element on the second surface.

11. The method of claim 10, wherein providing conductive elements on the first surface further comprises placing one or more solder balls on the conductive element pads on the first surface.

* * * * *

UNITED STATES PATENT AND TRADEMARK OFFICE
CERTIFICATE OF CORRECTION

PATENT NO.      : 7,381,591 B2
APPLICATION NO. : 11/437550
DATED           : June 3, 2008
INVENTOR(S)     : Moden It is certified that error appears in the above-identified patent and that said Letters Patent is hereby corrected as shown below:

In column 6, line 13, in Claim 1, after "the" insert -- opposing --.

In column 6, line 19, in Claim 1, after "surface" insert -- of the substrate --.

In column 6, line 28, in Claim 1, after "the" insert -- opposing --.

In column 6, line 31, in Claim 1, after "the" insert -- opposing --.

In column 6, line 48, in Claim 5, delete "bail" and insert -- ball --, therefor.

In column 6, line 56, in Claim 5, after "surface" insert -- of the substrate --.

In column 6, line 56, in Claim 5, after "and the" insert -- opposing --.

In column 6, line 58, in Claim 5, after "the" insert -- opposing --.

In column 6, line 62, in Claim 5, after "surface" insert -- of the substrate --.

In column 6, line 65, in Claim 5, delete "ads" and insert -- pads --, therefor.

In column 6, line 67, in Claim 5, after ";" delete "and".

In column 7, line 4, in Claim 5, after "the" insert -- opposing --.

In column 7, line 4, in Claim 5, after ";" insert -- and --.

In column 7, line 7, in Claim 5, after "the" insert -- opposing --.

In column 7, line 10, in Claim 6, delete "surface." and insert -- surface of the substrate. --, therefor.

In column 7, line 13, in Claim 7, delete "surface." and insert -- surface of the substrate. --, therefor.

In column 7, line 16, in Claim 8, delete "surface." and insert -- surface of the substrate. --, therefor.

In column 7, line 23, in Claim 9, delete "ads" and insert -- pads --, therefor.

In column 7, line 27, in Claim 9, after "the" insert -- opposing --.

In column 7, line 31, in Claim 9, after "surface" insert -- of the substrate --.

In column 7, line 40, in Claim 9, after "the" insert -- opposing --.

In column 7, line 43, in Claim 9, after "the" insert -- opposing --.

In column 7, line 46, in Claim 9, before "to" insert -- of the substrate --.

In column 8, line 6, in Claim 10, after "surface" insert -- of the substrate --.

In column 8, line 6, in Claim 10, after "and the" insert -- opposing --.

In column 8, line 15, in Claim 10, after "the" insert -- opposing --.

In column 8, line 19, in Claim 10, after "surface" insert -- of the substrate --.

In column 8, line 20, in Claim 10, before "die" insert -- semiconductor --.

In column 8, line 28, in Claim 10, after "the" insert -- opposing --.

In column 8, line 28, in Claim 10, delete "surface;" and insert -- surface of the substrate; --, therefor.

In column 8, line 31, in Claim 10, after "the" insert -- opposing --.

In column 8, line 34, in Claim 10, before "to" insert -- of the substrate --.

In column 8, line 35, in Claim 10, delete "substrate:" and insert -- substrate; --, therefor.

In column 8, line 37, in Claim 10, before "to a" insert -- of the substrate --.

In column 8, line 37, in Claim 10, delete "surface," and insert -- surface of the substrate, --, therefor.

In column 8, line 39, in Claim 10, after "the" insert -- opposing --.

In column 8, line 40, in Claim 10, after "the" insert -- opposing --.

In column 8, line 41, in Claim 10, delete "surface." and insert -- surface of the substrate. --, therefor.

In column 8, line 43, in Claim 11, after "surface" insert -- of the substrate --.

In column 8, line 45, in Claim 11, delete "surface." and insert -- surface of the substrate. --, therefor.

Signed and Sealed this

Nineteenth Day of January, 2010

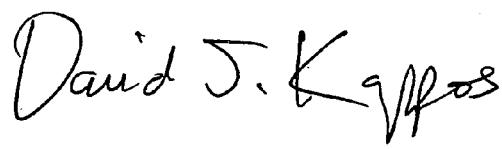

David J. Kappos
*Director of the United States Patent and Trademark Office*